United States Patent [19]

Tzeng

[11] 4,390,833
[45] Jun. 28, 1983

[54] VOLTAGE REGULATOR CIRCUIT

[75] Inventor: Chin-Pyng J. Tzeng, Placentia, Calif.

[73] Assignee: Rockwell International Corporation, El Segundo, Calif.

[21] Appl. No.: 266,239

[22] Filed: May 22, 1981

[51] Int. Cl.$^3$ ............................................. G05F 1/56
[52] U.S. Cl. ................................... 323/280; 323/281
[58] Field of Search ........................ 307/296 R, 297; 323/225, 273, 277, 280, 281

[56] References Cited

U.S. PATENT DOCUMENTS

| 4,135,125 | 1/1979 | Oura ................................... 323/313 |
| 4,152,716 | 5/1979 | Torii et al. ....................... 323/225 X |
| 4,232,261 | 11/1980 | Lingstaedt et al. ............. 323/281 X |

Primary Examiner—A. D. Pellinen
Attorney, Agent, or Firm—H. Fredrick Hamann; James F. Kirk

[57] ABSTRACT

A voltage regulator circuit adapted to operate between a voltage source and a voltage source return, to supply a predetermined output voltage at an output voltage terminal to a load comprising: a voltage reference means for supplying a reference voltage approximating the desired output voltage, an output voltage scaling means providing a scaled output voltage signal, an amplifier means having a first input, responsive to said reference voltage, a second input, responsive to said scaled output voltage signal, said amplifier amplifying the voltage difference between said first and second inputs to provide an output voltage determining control signal, an output multiterminal semiconductor device having a first and second conduction path terminal and a control terminal, said first conduction path terminal being connected to said voltage source, said second conduction path terminal being connected to said output voltage terminal, said control terminal being responsive to said control signal to provide current to said load in relatively constant output voltage determining relation.

18 Claims, 3 Drawing Figures

VOLTAGE REGULATOR CIRCUIT

BACKGROUND OF THE INVENTION

1. Field of the Invention

This invention relates to integrated circuits, and particularly to metal oxide semiconductor large scale integrated circuit (MOS LSI) devices having n-channel or p-channel MOS field effect transistors, such as are commonly used in hand calculators, home and office computers, automotive and industrial control systems and other commercial products. MOS LSI devices use numerous circuit designs to achieve specific functions. One of the circuit designs used in MOS LSI devices is a linear voltage regulator circuit, i.e., a circuit which provides a predetermined fixed output voltage to a variable load, which is relatively insensitive to variations in load current, changes in line or input voltage and variations in temperature. The invention circuit provides these features and is particularly suitable for manufacture by standard integrated circuit processing steps.

2. Description of the Prior Art

While many circuits exist that are useful as voltage reference sources, all such known circuits have a large number of components to effect a precise output voltage. Typical of one such circuit is the one disclosed in "A New NMOS Temperature Stable Voltage Reference" by Blauschild et al. published in the IEEE Journal of Solid State, Vol. SC13, No. 6, Dec. 1978, beginning at page 677. However, such a circuit includes sixteen FETs to achieve its purposes. On the other hand, the subject circuit includes only four FETs functioning as a reference voltage source and amplifier and one FET functioning as a linear pass regulator transistor.

Presently known linear voltage regulator circuits using insulated gate field effect transistors (IGFET) are difficult to produce with a narrowly predictable output voltage in MOS LSI devices because of circuit sensitivity to transistor threshold voltage (Vth), process variations relating to oxide thickness, substrate resistivity and other yield affecting factors. The invention circuit provides a very predictable output voltage and is particularly compatible with manufacturing techniques in MOS processes for structuring n-channel, p-channel, metal gate or silicon gate devices using single or double polysilicon layers.

SUMMARY OF THE INVENTION

It is, therefore, a major objective of this invention to provide a voltage regulator circuit for use in MOS/LSI devices, using relatively few components and providing a predetermined fixed output voltage to a variable load.

Another objective of this invention is to provide a voltage regulator circuit that is relatively insensitive to supply voltage and temperature variations.

Another objective of this invention is to provide a voltage regulator circuit that is relatively insensitive to supply voltage and temperature variations, and which is compatible with manufacturing techniques used in MOS circuit processes.

It is another highly particular objective of the invention to provide a voltage regulator circuit adapted for manufacture exclusively from n-channel field effect transistors or exclusively from p-channel field effect transistors.

These and other objects of the invention are realized in a voltage regulator circuit adapted to operate between a voltage source and a voltage source return, and particularly adapted for fabrication exclusively from n-channel field effect transistors or exclusively from p-channel field effect transistors to supply a predetermined output voltge at an output voltage terminal to a load comprising: an inverter means having an inverter input terminal and an inverter output terminal, for inverting and amplifying the voltage difference between a voltage received at the inverter input terminal and a relatively fixed inverter threshold voltage, the inverter means providing an inverted control voltage at an inverter output terminal. The circuit also includes an output voltage scaling means having an output terminal providing a scaled output voltage signal at the output terminal. An amplifier means is included having a non-inverting input terminal and an inverting input terminal and an output terminal, for amplifying the voltage difference between the non-inverting input terminal and the inverting input terminal to provide an output voltage determining control signal at the amplifier means output terminal. The inverter output terminal is connected to the amplifier means non-inverting input terminal, and the output voltage scaling means output terminal is connected to the inverter means inverter input terminal and to the amplifier means inverting input terminal. An output multiterminal semiconductor device is included having a first and second conduction path terminal and a control terminal, the first conduction path terminal being connected to the voltage source, the second conduction path terminal being connected to the output voltage terminal. The control terminal is connected to the amplifier means output terminal and is responsive to the output voltage determining control signal to provide current to the load in relatively constant output voltage determining relation.

In a particular embodiment, the inverter amplifier means for supplying an inverted control voltage is further comprised of: a third and fourth multiterminal semiconductor device, each respective multiterminal semiconductor device having a control grid and a conduction channel having a first and second terminal. The third multiterminal semiconductor device conduction channel first terminal is connected to the voltage source. The third multiterminal semiconductor device conduction channel second terminal is connected to the third multiterminal semiconductor device control grid, to the fourth multiterminal semiconductor device conduction channel first terminal and to the inverter output terminal. The fourth multiterminal semiconductor device conduction channel second terminal is connected to the voltage source return and the fourth multiterminal semiconductor device control grid is connected to the inverter input terminal.

The third multiterminal semiconductor device is thereby adapted to provide a predetermined bias current to the fourth multiterminal semiconductor device conduction channel first terminal. The fourth multiterminal semiconductor device terminates the predetermined bias current and current from the inverter output terminal. The fourth multiterminal semiconductor device provides inversion and amplification of the voltage difference between a voltage received at the inverter input terminal and the relatively fixed threshold voltage of the fourth multiterminal semiconductor device. The fourth multiterminal semiconductor device thereby provides the inverted control voltage at the inverter output terminal.

In a more particular embodiment, the invention provides a voltage reference means for supplying a reference voltage wherein the reference current source means comprises a multiterminal semiconductor device having a first and second conduction channel terminal and a control terminal, the first conduction channel terminal being connected to the voltage source and the second conduction channel terminal being connected to the control terminal and to the reference voltage terminal, and wherein the means for terminating the reference current to produce the predetermined reference voltage at the reference voltage terminal to approximate the desired output voltage is further comprised of a terminating multiterminal semiconductor device having a first and second conduction path terminal and a control terminal, the control terminal being connected to the amplifier means second input and to the output voltage scaling means output terminal, the terminating device second conduction path terminal being connected to the voltage source return, and the terminating device first conduction path terminal being connected to the reference current source device second conduction channel terminal and control terminal, this junction comprising the reference voltage terminal and providing a predetermined range of reference voltage in output voltage determining relation.

In an even more particular embodiment of the voltage regulator circuit, the amplifier means is further comprised of an amplifier multiterminal semiconductor device and an amplifier current source multiterminal device, each having a first and second conduction channel terminal and a control terminal, the amplifier current source device second conduction channel terminal being connected to the amplifier current source device control terminal, to the amplifier device first conduction channel terminal and to said output device control terminal, said amplifier current source device first conduction channel terminal being connected to the voltage source, and the amplifier device second conduction channel terminal being connected to the amplifier means first input terminal, the amplifier device control terminal being connected to the amplifier means second input, whereby the amplifier current source device provides a predetermined current to the amplifier device first conduction channel terminal, the amplifier device providing the output voltage determining control signal at the amplifier device first conduction channel terminal to the output device control terminal in response to the voltage difference between the first and second amplifier means input.

In these particular embodiments, of the voltage regulator circuit the predetermined bias current from the inverter means third multiterminal semiconductor device to the fourth multiterminal semiconductor device first terminal is adapted to be more than one order of magnitude more than the value of the predetermined current from the inverter output terminal to the fourth multiterminal semiconductor device first terminal. The inverted control voltage at the inverter output terminal thereby is adapted to be relatively unresponsive to variations in amplifier device control channel current.

In yet an even more particular embodiment of the voltage regulator circuit wherein the output voltage scaling means comprises a voltage divider, the divider further comprises a first and second resistive element, the first resistive element first terminal being connected to said output voltage terminal, the second resistive element second terminal being connected to said voltage source return, the first resistive element second terminal and the second resistive element first terminal being connected to the output voltage scaling means output terminal there providing the scaled output voltage signal.

In the foregoing embodiment of the voltage scaling means, the first and second resistive elements are formed by resistors, or in the alternative by multiterminal semiconductor devices having their respective conduction channels connected at the output voltage scaling means output terminal, the conduction channels form a series divider between the output voltage terminal and the voltage source return, and the semiconductor devices are scaled in conductivity to provide a predetermined scaled output voltage signal at the output voltage scaling means output terminal.

In a particular embodiment of the voltage scaling means the first and second resistive element multiterminal semiconductor devices are further comprised of depletion mode FET transistors.

In still another particular embodiment of the voltage regulator circuit, the third multiterminal semiconductor device and the amplifier current source multiterminal semiconductor device and the output multiterminal semiconductor device are further comprised of depletion mode FET transistors, the fourth multiterminal semiconductor device and the amplifier means amplifier multiterminal semiconductor device are enhancement mode FET transistors and all FET transistors are n-channel devices.

In another particular embodiment of the invention, the voltage regulator circuit is adapted to operate between a voltage source and a voltage source return to provide a predetermined output voltage at an output terminal, to a load connected between the output terminal and the voltage source return and comprises: an output voltage scaling means having an output terminal and an input terminal providing a scaled output voltage signal at the output terminal, first, second, third, fourth and fifth multiterminal semiconductor devices having respective first and second conduction path terminals and respective control terminals, the first conduction path terminal of the second, third and fifth multiterminal semiconductor devices being connected to the voltage source, the second conduction path terminal of the fourth multiterminal semiconductor device being connected to the voltage source return, the second conduction path terminal and the control terminal of the second multiterminal semiconductor device being connected to the first conduction path terminal of the first multiterminal semiconductor device and to the control terminal of the fifth multiterminal semiconductor device, the second conduction path terminal of the first and third multiterminal semiconductor device being connected to the control terminal of the third multiterminal semiconductor device and to the first conduction path terminal of the fourth multiterminal semiconductor device, the control terminal of the first and fourth multiterminal semiconductor devices being adapted to receive the scaled output voltage signal, the first and fourth multiterminal semiconductor devices being responsive to the scaled output voltage signal and acting to provide an output voltage determining control signal to the control terminal of the fifth multiterminal semiconductor device, the second conduction path terminal at the fifth multiterminal device being connected to the output terminal and to the output voltage scaling means input terminal, and the fifth multiterminal semiconductor device being responsive to the control signal, to provide current to the load in relatively constant output voltage determining relation.

In an even more particular embodiment of the voltage regulator circuit, the output voltage scaling means comprises a voltage divider, the divider further comprising first and second resistive elements, each having a first and second terminal, the first element first terminal being connected to the output voltage terminal, the second element second terminal being connected to the voltage source return, the first element second terminal and said second element first terminal being connected to the output voltage scaling means output terminal, and providing a scaled output voltage signal at the output terminal, and the first and fourth multiterminal semiconductor device control terminals being connected to the scaling means output terminal and responsive to the scaled output voltage at the output terminal.

In still another particular embodiment of the voltage scaling means, the first and second resistive elements are resistors.

In yet another particular embodiment of the output voltage scaling means, the first and second resistive elements are formed by multiterminal semiconductor devices having their respective conduction channels connected at the output voltage scaling means output terminal, the conduction channels form a series divider between the output voltage terminal and the voltage source return, and the semiconductor devices are scaled in conductivity to provide a predetermined scaled output voltage signal at the output voltage scaling means output terminal.

In another embodiment of the foregoing, the first and second resistive element multiterminal semiconductor devices are further comprised of depletion mode FET transistors.

In a most particular embodiment of the voltage regulator circuit the second, third, and fifth multiterminal semiconductor devices are depletion mode FET transistors, and the first and fourth multiterminal semiconductor devices are enhancement mode FET transistors.

In each of the foregoing embodiments, of the voltage regulator circuit, the output voltage, $V_O$ is approximately predeterminable from the equation:

$$V_o = [V_{T1} + [\sqrt{\beta_3/\beta_4}\,]|V_{T3}|][(R_1 + R_2)/R_2]$$

wherein $V_0$=circuit output voltage, $V_{T1}$ and $V_{T3}$ are threshold voltages of the first and third multiterminal semiconductor devices, respectively, $\beta_3$ and $\beta_4$ are the W/L ratios for the third and fourth multiterminal semiconductor devices, respectively, and $R_1$ and $R_2$ are the resistance values for the first and second resistive elements, respectively.

BRIEF DESCRIPTION OF THE DRAWINGS

The invention will be further described as to an illustrative embodiment in conjunction with the accompanying drawings in which.

DESCRIPTION OF THE PREFERRED EMBODIMENT

Figures 1, 2:
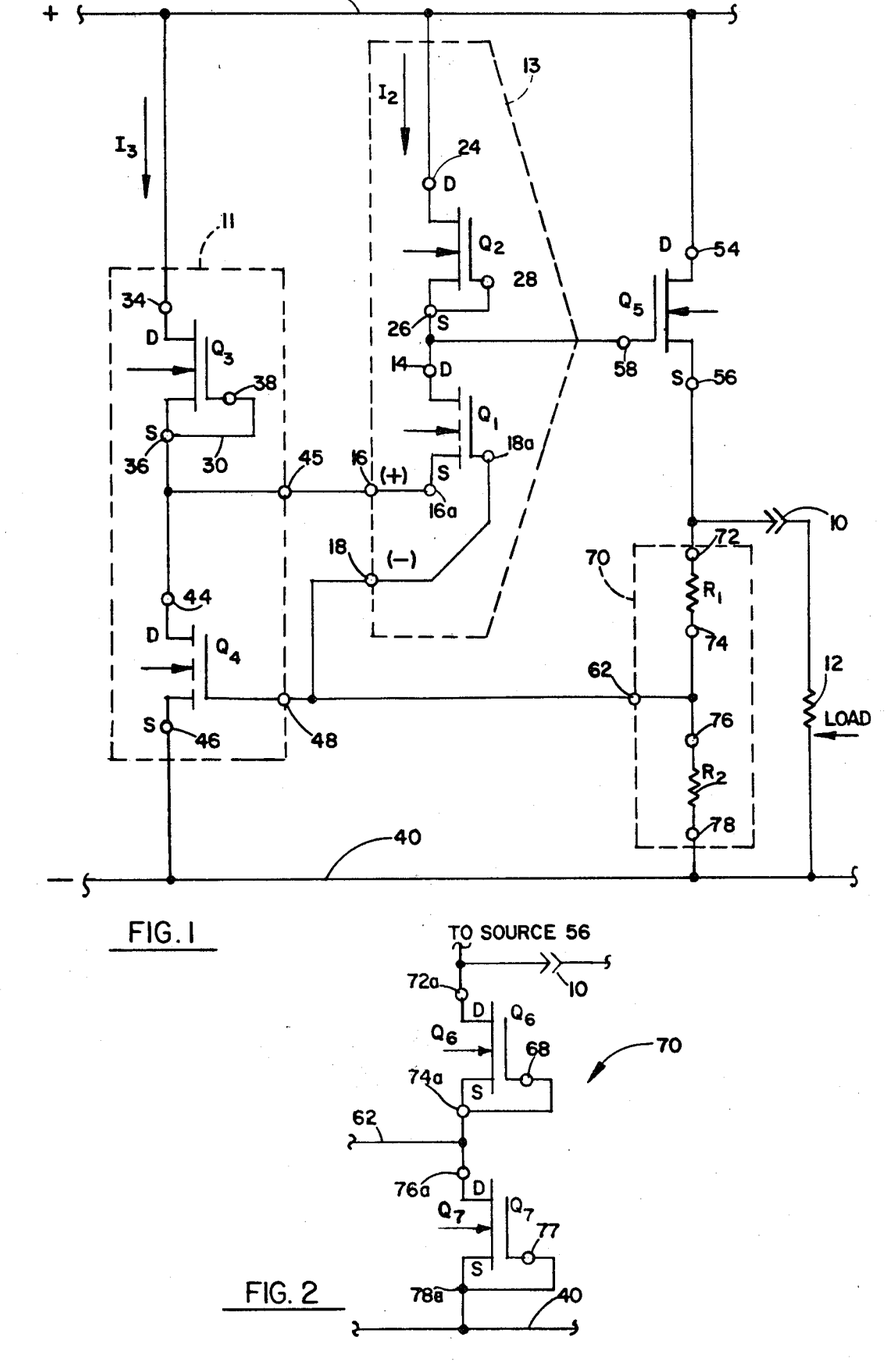
FIG. 1 is a schematic of the voltage regulator circuit.
FIG. 2 is a schematic of an alternate embodiment of the output voltage scaling means using n-channel depletion mode insulated gate FET transistors.

Referring now to FIG. 1, there is shown a schematic for a preferred embodiment of the invention voltage regulator circuit adapted to operate between a voltage source, such as Vcc, and a voltage source return 40, such as ground, to supply a predetermined output voltage at an output voltage terminal 10 to a load 12. The invention circuit is shown comprised of multiterminal semiconductor devices such as n-channel depletion mode field-effect transistors (FETS) Q2, Q3 and Q5 and n-channel enhancement mode FETS Q1 and Q4.

The invention contemplates provision of inverter amplifier means 11 having an inverter input terminal 48 and an inverter output terminal 45, for inverting and amplifying the voltage difference between a voltage received at the inverter input terminal 48 and a relatively fixed inverter threshold voltage, such as the gate to source threshold, $V_{th}$ of FET Q4. The inverter means 11 provides an inverted control voltage at an inverter output terminal 45.

An amplifier means 13 is included having a non-inverting input terminal 16 and an inverting input terminal 18 and an output terminal common to the Q5 gate 58. The amplifier means amplifies the voltage difference between the non-inverting input 16 and the inverting input 18 to provide an output voltage determining control signal at the amplifier means output terminal common to gate 58.

The inverter output terminal 45 is connected to the amplifier means non-inverting input terminal 16, and the output voltage scaling means output terminal 62 is connected to the inverter means inverter input terminal 48 and to the amplifier means inverting input terminal 18. Output multiterminal semiconductor device Q5, has a first and second conduction path terminal 54, 56 and a control terminal, gate 58, the first conduction path terminal 54 being connected to the voltage source $V_{cc}$. The second conduction path terminal, source 56, is connected to the output voltage terminal 10. The control terminal, gate 58 is common with the amplifier means output terminal and is responsive to the output voltage determining control signal to provide current to the load in relatively constant output voltage determining relation.

The inverter means for supplying an inverted control voltage is further comprised: a third and fourth multiterminal semiconductor device, Q3, Q4 each respective multiterminal semiconductor device having a control grid and a conduction channel having a first and second terminal. The third multiterminal semiconductor device conduction channel first terminal, drain 34 is connected to the voltage source. The third multiterminal semiconductor device control grid, source 36, conduction channel second terminal is connected to the third multiterminal semiconductor device, gate 38 and to the fourth multiterminal semiconductor device conduction channel first terminal, drain 44 and to the inverter output terminal 45. The fourth multiterminal semiconductor conduction channel device second terminal, source 46 is connected to the voltage source return 40. The fourth multiterminal semiconductor device control grid, gate 48 is common to the inverter input terminal 48.

The third multiterminal semiconductor device Q3 is adapted to provide a predetermined bias current to the fourth multiterminal semiconductor device conduction channel first terminal 44. The fourth multiterminal semiconductor device terminates the predetermined bias current and current from the inverter output terminal 45. The fourth multiterminal semiconductor device provides inversion and amplification of the voltage difference between a voltage received at the inverter input terminal 48 and the relatively fixed threshold voltage fourth multiterminal semiconductor device. The fourth multiterminal semiconductor device thereby provides the inverted control voltage at the inverter output terminal 45.

The output voltage scaling means 70 is shown comprising R1 and R2 connected in series at output voltage scaling means output terminal 62 and between output voltage terminal 10 and voltage source return 40. First resistive element R1 is shown having a first terminal 72 connected to output voltage terminal 10. The second resistive element second terminal 78 is shown connected to the voltage source return 40. The first resistive element second terminal 74 and the second resistive element first terminal 76 are shown connected to the output voltage scaling means output terminal 62 there providing a scaled output voltage signal.

The invention circuit contemplates embodiments of the output voltage scaling means fabricated both on and apart from the MOS LSI device. By providing one or more trimable resistive elements R1 or R2, on or apart from the MOS LSI device using the invention circuit, the output voltage to load 12 can be set to a predetermined value with precision.

FIG. 2 shows an alternative embodiment of the output voltage scaling means 70a comprising a voltage divider, the divider further comprising a first depletion mode FET Q6 and a second depletion mode FET Q7. FET Q6 and FET Q7 are shown having their respective conduction channels connected to the output voltage scaling means output terminal 62, these channels forming a series divider between the output voltage terminal 10 and the voltage source return 40.

The first conduction channel terminal 72a of Q6 is connected to output voltage terminal 10. The second conduction channel terminal 74a of Q6 is connected to control terminal 68, to the output terminal 62, and to the first conduction channel terminal 76a of Q7. The second conduction channel terminal 78a is connected to control terminal 77 and to voltage source return 40. Q6 and Q7 semiconductor devices are scaled in conductivity to provide a predetermined scaled output voltage signal at the output voltage scaling means output terminal 62.

Referring to FIG. 1, a first, second, third, fourth and fifth multiterminal semiconductor device, Q1 through Q5, are shown having respective first and second conduction path terminals, each first conduction path terminal being designated by the drain D, and each second conduction path terminal being designated by the source S.

The first conduction path terminal 24, 34, 54 of the second, third and fifth multiterminal semiconductor device FETS Q2, Q3, Q5 respectively are shown connected to the voltage source Vcc. The second conduction path terminal 46 of the fourth multiterminal device Q4 is shown connected to the voltage source return 40. The second conduction path terminal 26 and the control terminal 28 of the second multiterminal semiconductor device Q2 is shown connected to the first conduction path terminal 14 of the first multiterminal semiconductor device Q1 and to the control terminal 58 of the fifth multiterminal semiconductor device Q5. The second conduction path terminals 16, 36 of the first and third multiterminal semiconductor devices FETS Q1, Q3 are shown connected to the control terminal 38 of the third multiterminal semiconductor device Q3, and to the first conduction path terminal 44 of the fourth multiterminal semiconductor device Q4. The amplifier means, inverting input terminal 18; the inverter means inverter input terminal 48 of the first and fourth multiterminal semiconductor devices, FET Q1 and FET Q4 are shown connected to output voltage scaling means output terminal 62, to receive the scaled output voltage signal. The first and fourth multiterminal semiconductor devices, FET Q1 and FET Q4 are responsive to the scaled output voltage signal and act to provide an output voltage determining control signal to the control terminal 58 of the fifth multiterminal semiconductor device Q5. The second conductive path terminal 56 of the fifth multiterminal semiconductor device FET Q5 is shown connected to the output terminal 10 and to the output voltage scaling means input terminal 72, the fifth multiterminal semiconductor device responds to the control signal to provide current to the load in relatively constant output voltage determining relation.

Circuit Operation

The low voltage regulator invention circuit shown in FIG. 1 provides a predetermined voltage, Vo, at output 10 to load 12. The output voltage, Vo, approximately depends from the following equation:

$$V_o \cong [V_{T1} + [\sqrt{\beta_3/\beta_4}\,]|V_{T3}|][(R_1 + R_2)/R_2]$$

in which $V_{T1}$ and $V_{T3}$ are process controlled theshold voltages of transistors Q1 and Q3, respectively.

The threshold voltage, $V_T$, of an insulated gate, IGFET, is defined as the gate-to-source voltage, $V_{GS}$, at which the channel current begins to flow as the $V_{GS}$ voltage is increased. The threshold voltage of all IGFET's within an integrated circuit are process dependent, relatively predictable, and repeatable.

Operation of the circuit of FIG. 1 requires that $I_3$, the quiescent or bias current through Q3 be substantially larger than the bias current $I_2$ through Q2. $I_3$ is typically adjusted to operate having a value of fifty times greater than $I_2$. The relative magnitudes of the $I_3$ and $I_2$ currents are adjusted by adjusting the physical size of the respective transistors. Thus, the current through an IGFET is increased or decreased by increasing or decreasing the physical width of the conduction channel of the device. Alternatively, the length of the conduction channel is increased or decreased to decrease or increase the conductivity of the IGFET.

The term $\beta$ represents the ratio of the channel width, W, to the channel length, L. The designer using the subject invention in large or small scale integrated circuit applications specifies the W and L dimension, typically in micrometers, for the Q3 and Q4 transistors. By adjusting the W/L ratio for Q3 and Q4, and by knowing the respective $V_T$ values the designer predetermines the output voltage.

Referring to FIG. 1, Q2 and Q3 are shown as n-channel depletion mode IGFET devices each having its respective gate 28, 38 connected to its respective source 26, 36 by conduction paths 20, 30 thereby insuring that Q2 and Q3 each operate with a $V_{GS}$ of zero volts. Depletion mode IGFET devices operating with a $V_{GS}$ of zero volts provide a predetermined channel current that remains relatively constant as the drain-to-source voltage, $V_{DS}$, is increased to a voltage in excess of a voltage in the range of one to two volts. The predictability of the channel current supplied by Q2 and Q3 results in their use as fixed quiescent or bias current sources.

The bias current supplied by Q2 passes from the Q2 source 26 to the Q1 drain 14, through the conduction channel of Q1, to the Q1 source 16 and from the Q1 source 16 to the Q4 drain 44. The bias current $I_2$ from Q2 is summed with the bias current $I_3$ from Q3 at the Q4 drain 44. The total of these two bias currents pass through the conduction channel of Q4 to the Q4 source 46, and from the Q4 source 46 to the relatively negative reference potential 40.

The $V_{DS}$ of Q4 is principally dependent on the bias current $I_3$ from Q3. The output voltage $V_o$ is increased by increasing $I_3$ or decreased by decreasing $I_3$. Q4 operates to produce a more positive voltage at the drain 44 of Q4 in response to an increase of $I_3$ and a lower voltage in response to a reduction of $I_3$. The voltage at the drain 44 of Q4 is relatively independent of changes in the relatively positive reference potential, Vcc, in relation to the relatively negative reference potential 40 because Q3, operating in the saturation region provides relatively constant current to the drain 44 of Q4.

The predetermined and relatively constant voltage at the drain 44 of Q4 provides the reference voltage at reference voltage terminal 45, this reference voltage being referred to as $V_{45}$, being scaled to approximate, or approximating the desired output voltage Vo in accordance with the relationship:

$$V_{45} = Vo[R_2/(R_1=R_2)] - V_{T1}$$

wherein Vo is the predetermined output voltage at output voltage terminal 10, and $R_1$ and $R_2$ being the respective resistances of $R_1$ and $R_2$ as shown in FIG. 1.

Q1 and Q2 form an differential voltage amplifier. The gain of this amplifer is controlled by the size of the Q1 and Q2 transistors. A typical differential amplifier is designed with Q2 having a channel width W, of six and a channel length L, of twenty-four $\mu$m. A typical width of Q1 is one hundred and twenty and a typical channel length of four. The voltage gain is estimated by dividing the W/L ratio of Q1, or 120/4 by the W/L ratio of Q2, or 6/24. The estimated voltage gain is therefore: $(120/4)/(6/24) = 120$.

The Q1 and Q2 differential amplifier provide a control signal from the drain 32 of Q1 to the gate 58 of Q5. Q5 operates as a "series pass" or regulator transistor to control the current delivered from the output terminal 10 to the load. The voltage at output terminal 10 is scaled by the voltage divider formed by R1 and R2. A scaled output voltage is developed at the junction of R1 and R2, the scaling means output terminal 62. The scaled output voltage fed back to the Q1, Q2 differential amplifier inverting input, the gate 18 of Q1, and to the gate 48 of Q4.

The response of the circuit to a slight increase in load current is now used to illustrate the resulting signal flow and relative phasing required in response to the load current change. A slight increase in load current produces a slight decrease in output voltage at output terminal 10. This change results in a scaled decrease in voltage at terminal 62 which is applied to gate 48 of Q4 and gate 18 of Q1. The conductivities of Q4 and Q1 are diminished by the gate signal resulting in an increase in the voltage at the drain 44 of Q4 which is connected to the source 16 of Q1. The response of Q4 in producing a positive change in voltage at the source 16 of Q1 at the same instant that the voltage at the gate 18 of Q1 is being decreased provides an amplified voltage difference between the gate 18 and source 16 of Q1. The Q1 FET provides additional amplification as its conductivity decreases in response to the simultaneous decrease in voltage at gate 18 and increase in source voltage 18. The decrease in Q1 conductivity results in an increase in voltage at the source 14 of Q1. The increase in voltage at the source 14 of Q1, the output control signal, is fed to the gate 58 of Q5 thereby increasing the conductivity of Q5. An increase in the conductivity of Q5 provides additional current to output voltage terminal 10 and to load 12 compensating for the slight increase in load current and tending to diminish the decrease in output voltage. The voltage gain produced by Q1 and Q4 respectively combine to provide a very high feedback voltage gain to the gate 58 of Q5.

The voltage at the drain 44 of Q4 can be adjusted to operate over a wide range by controlling $I_3$. The range includes voltages very close to ground as well as voltages substantially above ground. The use of Q4 in conjunction with the Q1, Q2 inverting amplifier expands the useful adjustable range of the circuit output voltage at terminal 10 of the invention low voltage regulator circuit down to a useful limit close to ground 40 potential.

Figure 3:
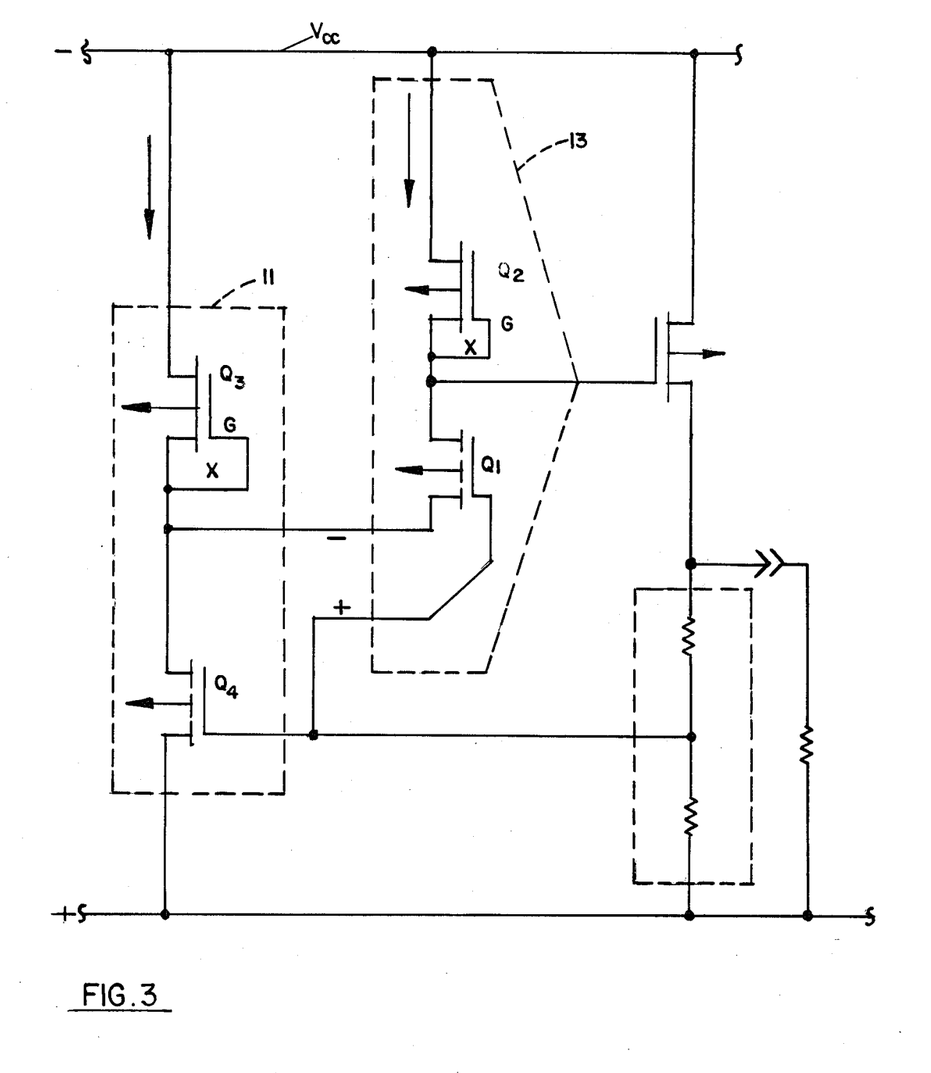
FIG. 3 is a schematic of the voltage regulator using p-channel FETs.

Referring to FIG. 2, Q6 and Q7 are shown as n-channel depletion mode insulated gate field-effect transistors operating in the non-saturated region as voltage divider resistors to produce a scaled output voltage at terminal 62. Use of the an output voltage scaling means, such as Q6 and Q7 enables the designer to provide regulated output voltages substantially greater than the $V_{TH}$ of Q4. FIG. 3 depicts an alternative embodiment of the invention circuit using p-channel MOS FETs. The voltage source Vcc is negative with respect to the return.

There is thus provided a voltage regulator circuit particularly useful in the design of MOS LSI devices requiring a predeterminable internally regulated voltage source that uses relatively few FET devices, and which is relatively insensitive to supply voltage and temperature variations. The description provided is intended to be illustrative only and is not intended to be limitative. Those skilled in the art may conceive of modifications which fall within the purview of the description are intended to be included therein as well. The scope of this invention shall be determined from the scope of the following claims including their equivalents.

I claim:

1. A voltage regulator circuit adapted to operate between a voltage source and a voltage source return, to supply a predetermined output voltage at an output voltage terminal to a load comprising:
   an inverter means having an inverter input terminal and an inverter output terminal, for inverting and amplifying the voltage difference between a voltage received at said inverter input terminal and a relatively fixed inverter threshold voltage, said inverter means providing an inverted control voltage at an inverter output terminal,
   an output voltage scaling means having an input terminal providing a scaled output voltage signal at said output terminal,
   an amplifier means having a non-inverting input terminal and an inverting input terminal and an output terminal, for amplifying the voltage difference between said non-inverting input and said inverting input to provide an output voltage determining control signal at said amplifier means output terminal, said inverter output terminal being connected to said amplifier means non-inverting input terminal, and said output voltage scaling means output terminal being connected to said inverter means inverter input terminal and to said amplifier means inverting input terminal, an output multiterminal semiconductor device having a first and second conduction path terminal and a control terminal, said first conduction path terminal being connected to said voltage source, said second conduction path terminal being connected to said output voltage terminal, said control terminal being connected to said amplifier means output terminal and being responsive to said output voltage determining control signal to provide current to said load in relatively constant output voltage determining relation.

2. The voltage regulator circuit of claim 1, wherein said inverter amplifier means for supplying an inverted control voltage is further comprised of:

a third and fourth multiterminal semiconductor device, each respective multiterminal semiconductor device having a control grid and a conduction channel having a first and second terminal, said third multiterminal semiconductor device conduction channel first terminal being connected to said voltage source, said third multiterminal semiconductor device conduction channel second terminal being connected to said third multiterminal semiconductor device control grid, to said fourth multiterminal semiconductor device conduction channel first terminal and to said inverter output terminal, said fourth multiterminal semiconductor device conduction channel second terminal being connected to said voltage source return and said fourth multiterminal semiconductor device control grid being connected to said inverter input terminal;

whereby, said third multiterminal semiconductor device is adapted to provide a predetermined bias current to said fourth multiterminal semiconductor device conduction channel first terminal, and said fourth multiterminal semiconductor device terminates said predetermined bias current and current from said inverter output terminal, said fourth multiterminal semiconductor device providing inversion and amplification of the voltage difference between a voltage received at said inverter input terminal and the relatively fixed threshold voltage of said fourth multiterminal semiconductor device, said fourth multiterminal semiconductor device thereby providing said inverted control voltage at said inverter output terminal.

3. The voltage regulator circuit of claim 2, wherein said amplifier means is further comprised of an amplifier multiterminal semiconductor device and an amplifier current source multiterminal semiconductor device, each having a first and second conduction channel terminal and a control terminal, said amplifier current source multiterminal semiconductor device second conduction channel terminal being connected to said amplifier current source multiterminal semiconductor device control terminal, to said amplifier multiterminal semiconductor device first conduction channel terminal and to said amplifier means output terminal, said amplifier current source multiterminal semiconductor device first conduction channel terminal being connected to said voltage source, said amplifier multiterminal semiconductor device second conduction channel terminal being connected to said amplifier means non-inverting input terminal, said amplifier multiterminal semiconductor device control terminal being connected to said amplifier means inverting input whereby, said amplifier current source multiterminal semiconductor device provides a predetermined current to said amplifier multiterminal semiconductor device first conduction channel terminal, said amplifier multiterminal semiconductor device providing said output voltage determining control signal at said amplifier multiterminal semiconductor device first conduction channel terminal in response to said amplifier means output terminal in response to the voltage difference between said amplifier means non-inverting and said amplifier means inverting inputs, said predetermined current to said amplifier multiterminal semiconductor device conduction channel first terminal passing through the amplifier multiterminal semiconductor device conduction channel to said amplifier means non-inverting input terminal and thence to said inverter means inverter output terminal.

4. The voltage regulator circuit of claim 3, wherein said predetermined bias current from said inverter means third multiterminal semiconductor device to said fourth multiterminal semiconductor device conduction channel first terminal is adapted to be more than one order of magnitude more than the value of the predetermined current from said inverter output terminal to said fourth multiterminal semiconductor device conduction channel first terminal, said inverted control voltage at said inverter output terminal thereby being adapted to be relatively unresponsive to variations in amplifier device conduction channel current.

5. The voltage regulator circuit of claim 4, wherein said output voltage scaling means comprises a voltage divider, said divider further comprising a first and second resistive element, said first resistive element first terminal being connected to said output voltage terminal, said second resistive element second terminal being connected to said voltage source return, said first resistive element second terminal and said second resistive element first terminal being connected to said output voltage scaling means output terminal there providing said scaled output voltage signal.

6. The voltage regulator circuit of claim 5, wherein said first and second resistive elements are resistors.

7. The voltage regulator circuit of claim 5, wherein said first and second resistive elements are formed by multiterminal semiconductor devices having their respective conduction channels connected at said output voltage scaling means output terminal, said conduction channels forming a series divider between said output voltage terminal and said voltage source return, said semiconductor devices being scaled in conductivity to provide a predetermined scaled output voltage signal at said output voltage scaling means output terminal.

8. The voltage regulator circuit of claim 7, wherein said first and second resistive element multiterminal semicondutor devices are further comprised of depletion mode FET transistors.

9. The voltage regulator circuit of claim 7, wherein said inverter means third multiterminal semiconductor device and said amplifier means amplifier current source multiterminal semiconductor device are further comprised of depletion mode FET transistors, and wherein said inverter means fourth multiterminal semiconductor device, and said amplifier means amplifier multiterminal semiconductor device and said output multiterminal semiconductor device are enhancement mode FET transistors.

10. The voltage regulator circuit of claim 9, wherein all FET transistors are n-channel devices.

11. The voltage regulator circuit of claim 9, wherein said voltage source is negative with respect to said voltage source return and wherein said FET transistors are p-channel devices.

12. A voltage regulator circuit adapted to operate between a voltage source and a voltage source return to provide a predetermined output voltage at an output terminal, to a load connected between said output terminal and said voltage source return comprising:

an output voltage scaling means having an output terminal and an input terminal providing a scaled output voltage signal at said output terminal, a first, second, third, fourth and fifth multiterminal semiconductor device having respective first and second conduction path terminals and respective control terminals, said first conduction path terminal of said second, third, and fifth multiterminal semiconductor device being connected to said voltage source, said second conduction path terminal of said fourth multiterminal semiconductor device being connected to said voltage source return, said second conduction path terminal and said control terminal of said second multiterminal semiconductor device being connected to said first conduction path terminal of said first multiterminal semiconductor device and to said control terminal of said fifth multiterminal semiconductor device, said second conduction path terminal of said first and third, multiterminal semiconductor device being connected to said control terminal of said third multiterminal semiconductor device and to said first conduction path terminal of said fourth multiterminal semiconductor device, said control terminal of said first and fourth multiterminal semiconductor devices being adapted to receive said scaled output voltage signal, said first and fourth multiterminal semiconductor devices being responsive to said scaled output voltage signal and acting to provide an output voltage determining control signal to said control terminal of said fifth multiterminal semiconductor device, said second conduction path terminal at said fifth multiterminal device being connected to said output terminal and to said output voltage scaling means input terminal, said fifth multiterminal semiconductor device being responsive to said control signal, to provide current to said load in relatively constant output voltage determining relation.

13. The voltage regulator circuit of claim 12, wherein said output voltage scaling means comprises a voltage divider, said divider further comprising a first and second resistive element, said first element first terminal being connected to said output voltage terminal, said second element second terminal being connected to said voltage source return, said first element second terminal and said second element first terminal being connected to said outputvoltage scaling means output terminal, and providing a scaled output voltage signal at said output terminal, said first and fourth multiterminal semiconductor device control terminals being connected to said scaling means output terminal and being responsive to said scaled output voltage at said output terminal.

14. The voltage regulator circuit of claim 13, wherein said first and second resistive elements are resistors.

15. The voltage regulator circuit of claim 14, wherein said first and second resistive elements are formed by multiterminal semiconductor devices having their respective conduction channels connected at said output voltage scaling means output terminal, said conduction channels forming a series divider between said output voltage terminal and said voltage source return, said semiconductor devices being scaled in conductivity to provide a predetermined scaled output voltage signal at said output voltage scaling means output terminal.

16. The voltage regulator circuit of claim 15, wherein said first and second resistive element multiterminal semiconductor devices are further comprised of depletion mode FET transistors.

17. The voltage regulator circuit of claim 14, wherein said second, third, and fifth multiterminal semiconductor devices are depletion mode FET transistors, and wherein said first and fourth multiterminal semiconductor devices are enhancement mode FET transistors.

18. The voltage regulator circuit of claim 17, wherein said circuit output voltage, $V_0$ is approximately predeterminable from the equation:

$$V_o = [V_{T1} + [\sqrt{\beta_3/\beta_4}\,]|V_{T3}|][(R_1 + R_2)/R_2]$$

wherein
$V_0$ = circuit output voltage,
$V_{T1}$ and $V_{T3}$ are threshold voltages of the first and third multiterminal semiconductor devices, respectively,
$\beta_3$ and $\beta_4$ are the W/L ratios for the third and fourth multiterminal semiconductor devices, respectively, and
$R_1$ and $R_2$ are the resistance values for the first and second resistive elements, respectively.

* * * * *

UNITED STATES PATENT AND TRADEMARK OFFICE
CERTIFICATE OF CORRECTION

PATENT NO. : 4,390,833
DATED : June 28, 1983
INVENTOR(S) : Chin-Pyng J. Tzeng

It is certified that error appears in the above-identified patent and that said Letters Patent are hereby corrected as shown below:

Column 7, line 32 change [deplection] to read -- depletion --.
Column 8, line 16 change [conductive] to read -- conduction --.
Column 10, line 64 change [input] to read -- output --.
Column 14, line 15 change [outputvoltage] to read --
 output voltage --.

Signed and Sealed this

Fourth Day of October 1983

[SEAL]

Attest:

Attesting Officer

GERALD J. MOSSINGHOFF

Commissioner of Patents and Trademarks